United States Patent
Morie et al.

(10) Patent No.: US 9,019,006 B2
(45) Date of Patent: Apr. 28, 2015

(54) REFERENCE VOLTAGE STABILIZER CIRCUIT AND INTEGRATED CIRCUIT INCLUDING THE SAME

(71) Applicant: Panasonic Corporation, Osaka (JP)

(72) Inventors: Takashi Morie, Osaka (JP); Shiro Sakiyama, Kyoto (JP); Naoshi Yanagisawa, Osaka (JP); Toshiaki Ozeki, Osaka (JP); Takuji Miki, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/073,834

(22) Filed: Nov. 6, 2013

(65) Prior Publication Data

US 2014/0062750 A1  Mar. 6, 2014

Related U.S. Application Data

(63) Continuation of application No. PCT/JP2012/001385, filed on Feb. 29, 2012.

(30) Foreign Application Priority Data

May 16, 2011  (JP) ................................ 2011-109221

(51) Int. Cl.
  *H03B 1/00* (2006.01)
  *H03K 5/00* (2006.01)
  *H04B 1/00* (2006.01)
  *H03M 1/12* (2006.01)
  *G05F 3/16* (2006.01)

(52) U.S. Cl.
  CPC .. *H03M 1/12* (2013.01); *G05F 3/16* (2013.01)

(58) Field of Classification Search
  CPC ...... H04B 15/005; H04B 1/1623; G05F 1/52; G10H 3/182; H01J 1/135
  USPC ................... 327/313, 532, 551, 558
  See application file for complete search history.

(56) References Cited

U.S. PATENT DOCUMENTS 5,049,764 A  9/1991 Meyer
5,760,571 A  6/1998 Latham, II et al.
(Continued)

FOREIGN PATENT DOCUMENTS

JP  60-142525 U  9/1985
JP  2001-142548 A  5/2001
JP  2005-244771 A  9/2005

OTHER PUBLICATIONS

International Search Report issued in International Application No. PCT/JP2012/001385 with Date of mailing Apr. 10, 2012.

*Primary Examiner* — Quan Tra
(74) *Attorney, Agent, or Firm* — McDermott Will & Emery LLP

(57) ABSTRACT

A reference voltage is maintained stable against disturbance noise and self-noise of an internal circuit. A reference voltage stabilizer circuit for stabilizing the reference voltage to be supplied through at least one of first or second signal lines includes a preceding-stage circuit including a capacitive path connected between the first and second signal lines; and a subsequent-stage circuit including a resistive path connected between the first and second signal lines, and a resistive circuit inserted, between the capacitive path and the resistive path, into one of the first or second signal lines through which the reference voltage is supplied.

10 Claims, 12 Drawing Sheets

(56) References Cited

U.S. PATENT DOCUMENTS

| | | |
|---|---|---|
| 6,473,021 B1 | 10/2002 | Somayajula et al. |
| 8,629,733 B2 * | 1/2014 | Hollis et al. ............ 333/12 |
| 2001/0045873 A1 * | 11/2001 | Suzuki et al. ............ 333/12 |
| 2005/0062523 A1 * | 3/2005 | Wang et al. ............ 327/554 |
| 2009/0073019 A1 | 3/2009 | Ooi |

* cited by examiner

REFERENCE VOLTAGE STABILIZER CIRCUIT AND INTEGRATED CIRCUIT INCLUDING THE SAME

CROSS-REFERENCE TO RELATED APPLICATIONS

This is a continuation of International Application No. PCT/JP2012/001385 filed on Feb. 29, 2012, which claims priority to Japanese Patent Application No. 2011-109221 filed on May 16, 2011. The entire disclosures of these applications are incorporated by reference herein.

BACKGROUND

The present disclosure relates to a circuit configured to stabilize a reference voltage. In particular, the present disclosure relates to a reference voltage stabilizer circuit suitable for an AD converter.

AD converters have been broadly used in various fields of signal processing, and the conversion accuracy thereof is an important indicator for performance. In general, the AD converters perform AD conversion by comparing an input signal with a reference voltage. For such a reason, it is significantly important for maintenance of a high conversion accuracy to maintain the reference voltage stable with good accuracy. Depending on applications, lowering of the AD conversion accuracy often occurs due to superimposition of mV-order noise on the reference voltage. Thus, in order not to swing the reference voltage due to, e.g., disturbance noise or self-noise generated from the AD converter itself, it is important to stabilize the reference voltage.

In recent years, increasing attention has been given to successive approximation AD converters because of a high power efficiency thereof. FIG. 10 illustrates a configuration of a typical successive approximation AD converter. A successive approximation AD converter 100 includes a capacitor DAC 102 including a capacitor array for which capacitor values (1C, 4C, 8C, . . . , 512C illustrated in the figure) are weighted according to a binary ratio, a comparator 104 configured to compare an analog input voltage IN with a voltage generated by the capacitor DAC 102, a latch circuit 106 configured to store a comparison result, and a DAC controller 108 configured to control the capacitor DAC 102 based on a signal output from the latch circuit 106. In the capacitor DAC 102, first ends of the capacitor array are commonly connected to the analog input voltage IN, and each of second ends of the capacitor array is independently connected to one of reference voltages VREFH, VREFL (VREFH>VREFL) according to a multiple-bit control signal output from the DAC controller 108.

Operation of the successive approximation AD converter 100 is as follows. First, the analog input voltage IN is sampled at the capacitor DAC 102 in the state in which an MSB of a control signal is "1" and the other bits are "0." Then, based on a comparison result of the comparator 104, the DAC controller 108 successively determines, for each clock, the bits of the control signal one by one in the order from the MSB to lower bits. At this point, a signal generated in such a manner that a signal output from the latch circuit 106 is serial-parallel converted is an AD conversion result of the sampled analog input voltage IN.

If mV-order noise is superimposed on VREFH-VREFL at timing at which the comparator 104 is operated at each clock, an AD conversion error occurs. Moreover, the charge of the reference voltage VREFH, VREFL is consumed at timing at which a connection state of the second ends of the capacitor array is changed after the comparator 104 is operated. This causes self-noise of the AD converter.

Conventionally, it has been often the case that bypass capacitors (capacitive elements) are provided inside and outside an integrated circuit to remove noise superimposed on a reference voltage. Referring to, e.g., FIG. 11, in the configuration in which voltages supplied from an external power supply 200 are received by I/O pins P1, P2 and are then supplied to the AD converter 100 through signal lines L1, L2 as the reference voltages VREFH, VREFL, an external bypass capacitor (capacitive element 202) may be provided between the I/O pins P1, P2 outside an integrated circuit 300, and an internal bypass capacitor (capacitive element 203) may be provided between the signal lines L1, L2 inside the integrated circuit 300. However, due to an influence of a parasitic inductance 204 of a package of the integrated circuit 300, the external bypass capacitor becomes less effective around a frequency of 100 MHz or more. As a result, the external bypass capacitor no longer contributes to reduction in impedance of the signal line. If the capacitance of the internal bypass capacitor is increased in order to compensate for such a state, ringing of noise superimposed on the reference voltage occurs due to resonance with the parasitic inductance 204, and, as a result, it is difficult to reduce swing of the reference voltage. In fact, in order to obtain an about 10-bit AD conversion accuracy, it is necessary to provide an nF-order internal bypass capacitor to reduce self-noise of the AD converter 100. However, it is unrealistic to provide such a large capacitive element inside an integrated circuit.

Instead of the internal bypass capacitor, a buffer or an active bypass circuit (hereinafter collectively referred to as a "buffer etc.") may be provided inside an integrated circuit to reduce the impedance of a signal line. For example, in an example illustrated in FIG. 12, an active bypass circuit 206 is provided inside an integrated circuit 300 (see, e.g., U.S. Pat. No. 5,049,764). In this case, the response speed of the buffer etc., i.e., how quickly the buffer etc. responds to noise and removes such noise, is an important parameter. Since the response speed is limited, the buffer etc. cannot respond to instantaneous noise faster than the response speed of the butter etc. However, if time permits, the reference voltage can be changed back to an initial value.

Clock synchronization type discrete signal processing systems such as pipeline AD converters and successive approximation AD converters are characterized in that no influence is provided on an AD conversion accuracy as long as noise is sufficiently suppressed at the moment of AD conversion. Thus, even when self-noise is generated upon AD conversion, if settling of a reference voltage to a normal value can be performed by the moment of subsequent AD conversion, no problem arises. For such a reason, the buffer etc. can be effective measures against self-noise. However, if a conversion rate increases, it is, even with the high-power large-area buffer etc., difficult to perform settling within a required time. Moreover, a parasitic inductance of a package of an integrated circuit causes ringing of the output of the buffer etc., and further delays settling. Further, in the case of disturbance noise, timing at which noise comes in is unexpectable, and therefore it is necessary to instantaneously reduce noise to an acceptable level or less. For disturbance noise, it is necessary to use some abilities of a capacitive element which is capable of instantaneously responding.

Both of the internal bypass capacitor and the buffer etc. may be combined together. However, such a case provides a trade-off between reduction in disturbance noise and reduction in self-noise. Reduction in disturbance noise by increasing the capacitance of the internal bypass capacitor results in a delay in response of the buffer etc. and a delay in settling against self-noise. Needless to say, if an nF-order capacitive element is provided inside an integrated circuit, self-noise can be reduced only by such a capacitive element. However, this is unrealistic as described above. On the other hand, even if the response of the buffer etc. is improved by decreasing the capacitance of the internal bypass capacitor, a disturbance noise reduction effect is reduced. If disturbance noise is input right before the timing of AD conversion, settling cannot be performed, resulting in occurrence of an AD conversion error. In particular, in the case where a signal line for reference voltage is shared by a plurality of AD converters in, e.g., an interleaved AD converter, self-noise of a certain AD converter enters another AD converter as disturbance noise, resulting in a more serious problem.

FIG. 13 illustrates a configuration of a typical interleaved AD converter (hereinafter referred to as an "interleaved ADC"). In the interleaved ADC, each of signal lines L1, L2 is connected to four AD converters 100, and reference voltages VREFH, VREFL are shared by the AD converters 100. The reference voltages VREFH, VREFL are input respectively to I/O pins P1, P2 from an external power supply 200. If an internal power supply is provided, an external bypass capacity (capacitive element 202) may be additionally provided. Moreover, in the interleaved ADC, an internal bypass capacitor (capacitive element 203) is provided to reduce noise. Suppose that the AD conversion performance of the AD converter 100 is 10 bits and 50 MHz. The AD conversion performance of the interleaved ADC is equivalent to 10 bits and 200 MHz.

In comparison with a pipeline AD converter (hereinafter referred to as a "pipeline ADC") having the same performance as that of the interleaved ADC illustrated in FIG. 13, the interleaved ADC can be designed with power and an area much less than those of the pipeline ADC. On the other hand, even if the interleaved ADC and the pipeline ADC have the same conversion rate and conversion accuracy, a much higher accuracy is required for the reference voltages of the interleaved ADC, and a reference voltage circuit used for the pipeline ADC is not applicable to the interleaved ADC. This is because of the following reasons. In the pipeline ADC, the frequency of self-noise swinging a reference voltage is 200 HMz. On the other hand, in the interleaved ADC, each of the AD converters 100 performs a sampling operation at 50 MHz. However, since the configuration in which bits are successively compared one by one at each clock is employed, the internal clock of the interleaved ADC comes close to 1 GHz. Thus, if self-noise is superimposed on the reference voltage, it is necessary to perform settling to change the reference voltage back to an initial value within a short time of 1 ns. Moreover, in the interleaved ADC, self-noise of a certain AD converter 100 becomes disturbance noise for another AD converter 100. Since the self-noise of the certain AD converter 100 directly swings the reference voltage, the level of the self-noise is as high as the level of self-noise of the another AD converter 100. In addition, the self-noise of the certain AD converter 100 is input at timing different from that of the self-noise of the another AD converter 100. In order to perform settling by a buffer etc., settling should be performed within an unrealistic time, e.g., several hundred ps which is much more shorter than a time for self-noise in the case where a single AD converter 100 is provided. Otherwise, noise is input at timing of subsequent AD conversion, resulting in an AD conversion error.

It is necessary to supply a stable reference voltage not only to AD converters but also to various signal processing circuits. An extremely-stable reference voltage is required for successive approximation AD converters, in particular interleaved successive approximation AD converters, or parallelized AD converters. However, high-speed high-accuracy AD conversion cannot be ensured by stabilization of a reference voltage using conventional capacitive elements or buffers etc. Moreover, a combination of the capacitive elements and the buffers etc. provides a trade-off between reduction in disturbance noise and reduction in self-noise.

Therefore, there is a need for a reference voltage stabilizer circuit which is capable of maintaining a stable reference voltage against disturbance noise or self-noise of an internal circuit.

SUMMARY

According to one aspect of the present disclosure, a reference voltage stabilizer circuit for stabilizing a reference voltage to be supplied through at least one of first or second signal lines includes a preceding-stage circuit including a capacitive path connected between the first and second signal lines; and a subsequent-stage circuit including a resistive path connected between the first and second signal lines, and a resistive circuit inserted, between the capacitive path and the resistive path, into one of the first or second signal lines through which the reference voltage is supplied.

According to another aspect of the present disclosure, a reference voltage stabilizer circuit for stabilizing a reference voltage to be supplied through at least one of first or second signal lines includes a preceding-stage circuit including a capacitive path connected between the first and second signal lines; and a subsequent-stage circuit including a transistor inserted into one of the first or second signal lines through which the reference voltage is supplied and having a gate to which a bias voltage is applied, a bias generator circuit configured to generate the bias voltage, and a capacitive element connected between the gate of the transistor and the other one of the first or second signal lines into which the transistor is not inserted.

According to the foregoing configurations, the signal line through which the reference voltage is supplied is separated into an I/O pin side and an internal circuit side by the resistive circuit or the transistor inserted into such a signal line. Thus, without interference between the preceding-stage circuit and the subsequent-stage circuit, the preceding-stage circuit reduces disturbance noise, and the subsequent-stage circuit reduces self-noise of an internal circuit. As a result, the reference voltage can be stabilized.

DETAILED DESCRIPTION

Figure 1:
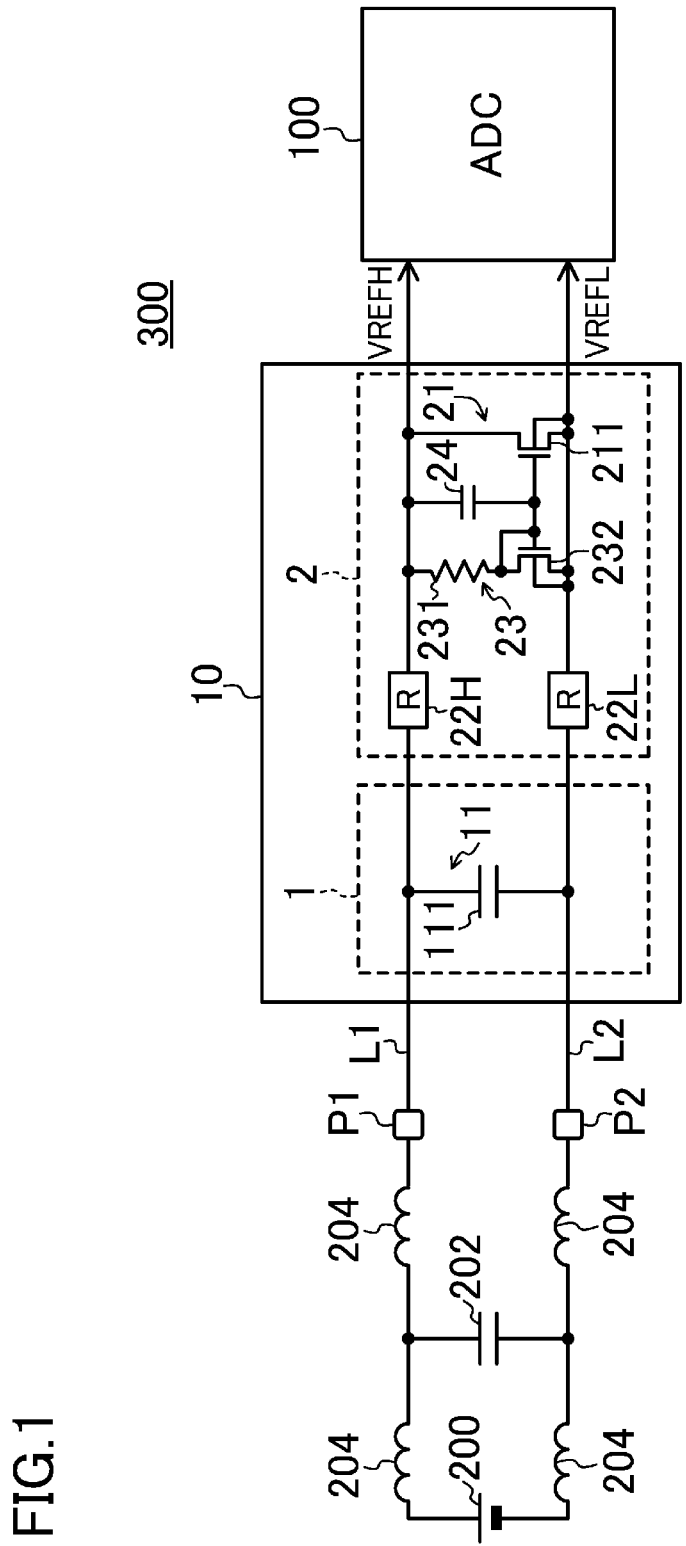
FIG. 1 is a configuration diagram of an integrated circuit including a reference voltage stabilizer circuit of an embodiment of the present disclosure.

An embodiment of the present disclosure will be described below in detail with reference to drawings. Note that the same reference numerals are used to represent identical or equivalent elements in figures, and the description thereof will not be repeated.

Figure 10:
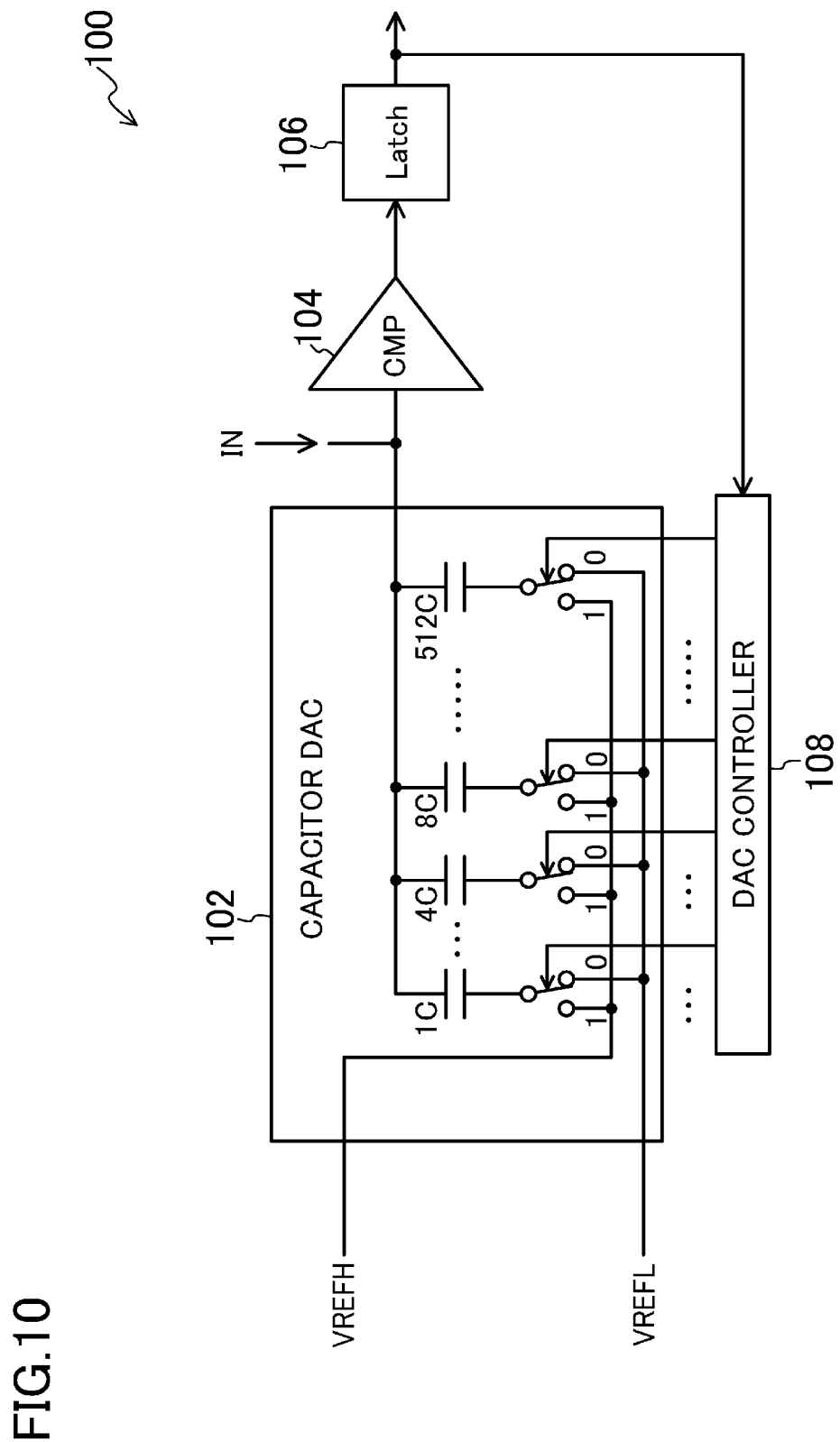
FIG. 10 is a configuration diagram of a typical successive approximation AD converter.
Figure 11:
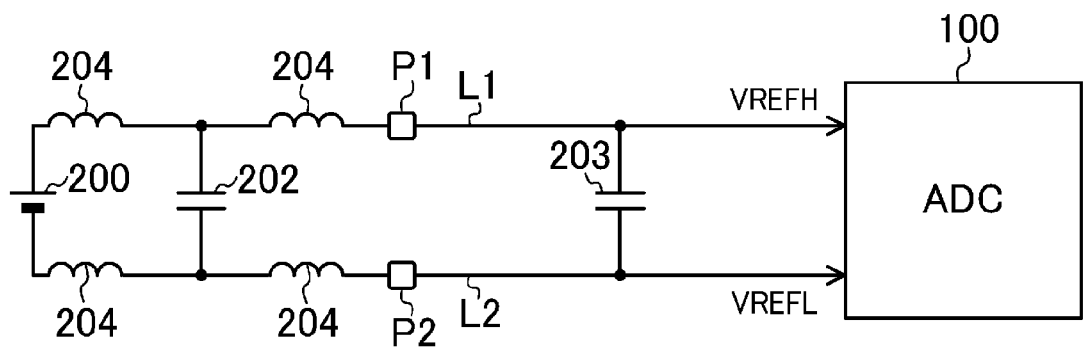
FIG. 11 is a diagram illustrating a configuration example in reference voltage stabilization using bypass capacitors.
Figure 12:
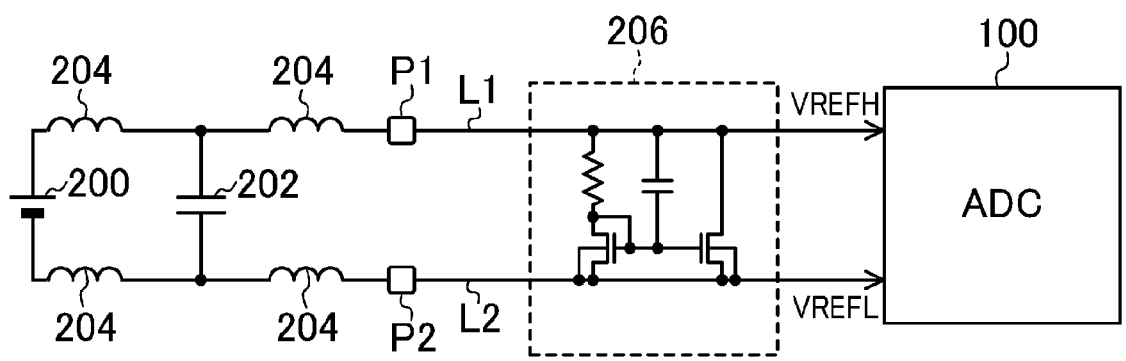
FIG. 12 is a diagram illustrating a configuration example in reference voltage stabilization using an active bypass circuit.
Figure 13:
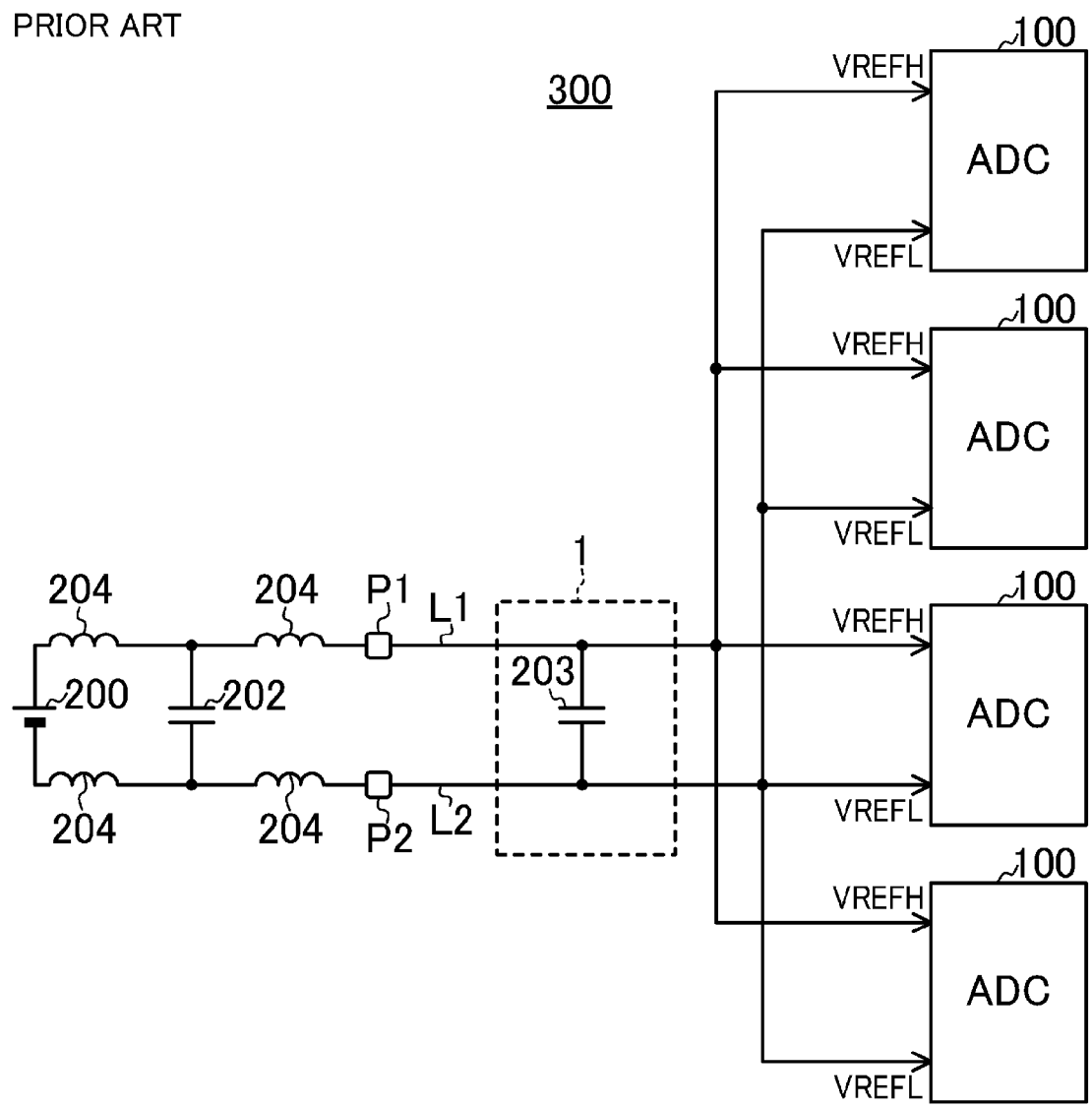
FIG. 13 is a configuration diagram of a typical interleaved AD converter.

FIG. 1 illustrates a configuration of an integrated circuit including a reference voltage stabilizer circuit of the embodiment of the present disclosure. A reference voltage stabilizer circuit 10 is configured to stabilize, e.g., a reference voltage VREFH, VREFL (VREFH>VREFL) input to an I/O pin P1, P2 from an external power supply 200 and supplied to an AD converter 100 through a signal line L1, L2. The AD converter 100 is, e.g., a successive approximation AD converter illustrated in FIG. 10. The reference voltage stabilizer circuit 10 and the AD converter 100 are mounted on an integrated circuit 300. Note that it is preferred that the reference voltage stabilizer circuit 10 is arranged closest to the I/O pins in the integrated circuit 300, i.e., near the I/O pins P1, P2, to supply the stable reference voltages VRFFH, VREFL to the AD converter 100 and other internal circuits which are not shown in the figure.

The reference voltage stabilizer circuit 10 includes a preceding-stage circuit 1 and a subsequent-stage circuit 2. The preceding-stage circuit 1 includes a capacitive path 11 connected between the signal lines L1, L2 and including a capacitive element 111.

The subsequent-stage circuit 2 includes a resistive path 21 connected between the signal lines L1, L2 and including a transistor 211 having a gate to which a bias voltage is applied, a resistive circuit 22H inserted into the signal line L1 between the capacitive path 11 and the resistive path 21, and a resistive circuit 22L inserted into the signal line L2 between the capacitive path 11 and the resistive path 21. The subsequent-stage circuit 2 further includes a bias generator circuit 23 configured to generate the bias voltage, and a capacitive element 24 connected between the gate and drain of the transistor 211. The bias generator circuit 23 can be configured such that a resistive element 231 and a diode-connected transistor 232 are connected together in series, and generates the bias voltage depending on a voltage between both ends of the resistive path 21.

Figure 2A:
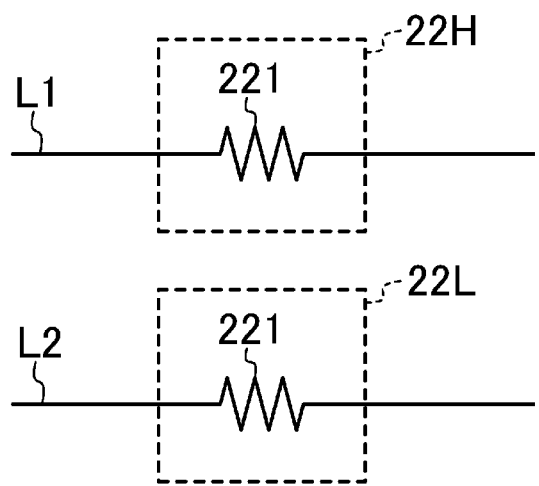
FIGS. 2A and 2B are diagrams illustrating configuration examples of a resistive circuit of a subsequent-stage circuit.
Figure 2B:
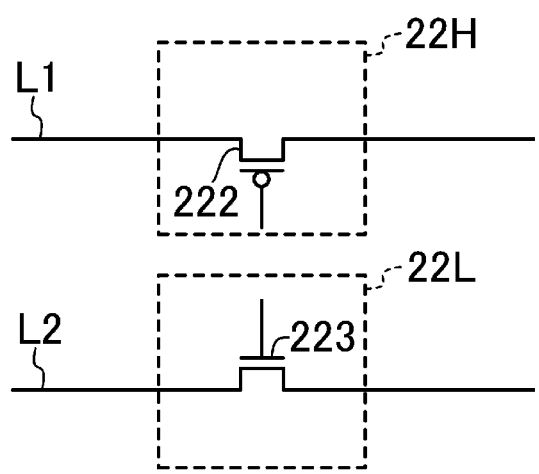

Referring to FIG. 2A, the resistive circuit 22H, 22L includes a resistive element 221. The resistive element 221 may be realized in such a manner that the sufficiently-long signal line L1, L2 is used as a wiring resistor. Alternatively, the resistive circuit 22H, 22L may include, referring to FIG. 2B, a transistor 222, 223 having a gate to which the bias voltage is applied. That is, the resistive circuit 22H, 22L may include a MOS resistor.

If a resistance value of the resistive circuit 22H, 22L is extremely large, an IR drop increases, and VREFH-VREFL decreases. Conversely, if the resistance value of the resistive circuit 22H, 22L is extremely small, later-described separation between the preceding-stage circuit 1 and the subsequent-stage circuit 2 is less likely to be realized. Thus, in any configurations, the resistance value of the resistive circuit 22H, 22L may fall within a range between 10 Ω and 100 Ω, and preferably a value of about several tens of Ω.

Next, operation and features of the reference voltage stabilizer circuit 10 will be described. The resistive circuit 22H, 22L is an impedance inserted into the signal line L1, L2, and the impedance separates the signal line L1, L2 into an I/O pin side and an internal circuit side. The preceding-stage circuit 1 is arranged on the I/O pin side, and the subsequent-stage circuit 2 is arranged on the internal circuit side. The capacitive path 11 of the preceding-stage circuit 1 functions as an internal bypass capacitor configured to reduce the impedance of the signal line L1, L2. On the other hand, the subsequent-stage circuit 2 is operated as follows. A certain bias voltage is supplied to the gate of the transistor 211 with high impedance, and a certain current flows between drain and source of the transistor 211. For example, when the reference voltage VREFH instantaneously increases due to noise, the noise instantaneously propagates to the gate of the transistor 211, and the drain-source current of the transistor 211 increases. This results in reduction in VREFH-VREFL, i.e., a voltage difference between the signal lines L1, L2 on the internal circuit side. Conversely, when the reference voltage VREFH instantaneously decreases, the drain-source current of the transistor 211 instantaneously decreases. This results in an increase in VREFH-VREFL. Moreover, when the reference voltage VREFL decreases, the gate voltage of the transistor 211 is substantially unchanged due to the function of the capacitive element 24. Thus, the gate-source current of the transistor 211 directly increases, and a variation in reference voltage VREFL is changed back. As described above, the subsequent-stage circuit 2 functions as a large-bandwidth stabilizer circuit configured to change back the voltage difference between the signal lines L1, L2 on the internal circuit side, i.e., VREFH-VREFL, in a short time even if noise is superimposed on the signal lines L1, L2 on the internal circuit side.

Although an external bypass capacitor (capacitive element 202) can be connected between the I/O pins P1, P2 to reduce the impedance of the signal line L1, L2, the external bypass capacitor becomes, as described above, less effective due to a parasitic inductance 204 of a package of the integrated circuit 300. However, disturbance noise entering from the I/O pin side is absorbed by the capacitive path 11 of the preceding-stage circuit 1, and does not propagate to the internal circuit side. Moreover, since the subsequent-stage circuit 2 is connected to the internal circuit side, the parasitic capacitance of the signal line L1, L2 on the internal circuit side is suppressed extremely low. Since the resistive circuit 22H, 22L is inserted into the signal line L1, L2, disturbance noise does not enter the internal circuit side, and there is only self-noise of the AD converter 100 on the internal circuit side. Thus, even if self-noise of the AD converter 100 is generated upon certain AD conversion, the subsequent-stage circuit 2 changes, by settling, the reference voltage VREFH, VREFL back to an initial value by subsequent AD conversion, thereby maintaining an AD conversion accuracy at a high level.

Conventionally, it is, due to a trade-off, necessary to reduce both of disturbance noise and self-noise by one of an internal bypass capacitor or a buffer etc. However, the reference voltage stabilizer circuit 10 of the present embodiment reduces each of disturbance noise and self-noise by a suitable method. That is, disturbance noise for which instantaneous reduction is required is reduced by the preceding-stage circuit 1 arranged on the I/O pin side. On the other hand, high-level self-noise which is difficult to be reduced only by a capacitive element but for which there is extra time until noise reduction is reduced by the subsequent-stage circuit 2 arranged on the internal circuit side. The capacitive path 11 of the preceding-stage circuit 1 interferes the subsequent-stage circuit 2, resulting in a delay in response speed of the subsequent-stage circuit 2. However, since the signal line L1, L2 is separated into the I/O pin side and the internal circuit side by the resistive circuit 22H, 22L, such an influence can be sufficiently reduced.

As in the foregoing, according to the present embodiment, even if the parasitic inductance 204 of the package of the integrated circuit 300 is large, the reference voltages VREFH, VREFL to be supplied to the AD converter 100 can be maintained stable, and the AD conversion accuracy can be maintained at the high level. The reference voltage stabilizer circuit 10 of the present embodiment can be used as a high-speed high-accuracy reference voltage stabilizer circuit for an AD converter 100 which has been difficult to be realized in the conventional configuration.

In the present embodiment, the AD converter 100 is separated from the parasitic inductances 204 by the resistive circuits 22H, 22L. Thus, even if the parasitic inductance 204 is large, the reference voltages VREFH, VREFL are maintained stable and are less likely to be susceptible to an influence of resonance. Consequently, there is an advantage that a large parasitic inductance 204 and an inexpensive package can be used.

The reference voltage stabilizer circuit 10 may stabilize only one of the reference voltages VREFH, VREFL. For example, if the signal line L2 is used as a ground line configured to supply a ground potential, only the reference voltage VREFH may be stabilized. In such a case, it is not necessary to insert the resistive circuit 22L into the signal line L2. Alternatively, e.g., if the signal line L1 is used as a power line configured to supply a power-supply voltage, only the reference voltage VREFL may be stabilized. In such a case, it is not necessary to insert the resistive circuit 22H into the signal line L1.

Depending on the AD converter 100, the power-supply voltage and the ground potential may be used as the reference voltages. However, in such a case, it is also preferred that the signal lines L1, L2 configured to supply the reference voltages are, in addition to the power line and the ground line, provided to supply the reference voltages stabilized by the reference voltage stabilizer circuit 10 to the AD converter 100. In this case, the I/O pin P1 may be used as an input terminal for the power-supply voltage to separate the power line and the signal line L1 from each other in the integrated circuit 300, and the I/O pin P2 may be used as an input terminal for the ground potential to separate the ground line and the signal line L2 from each other in the integrated circuit 300.

Figure 3:
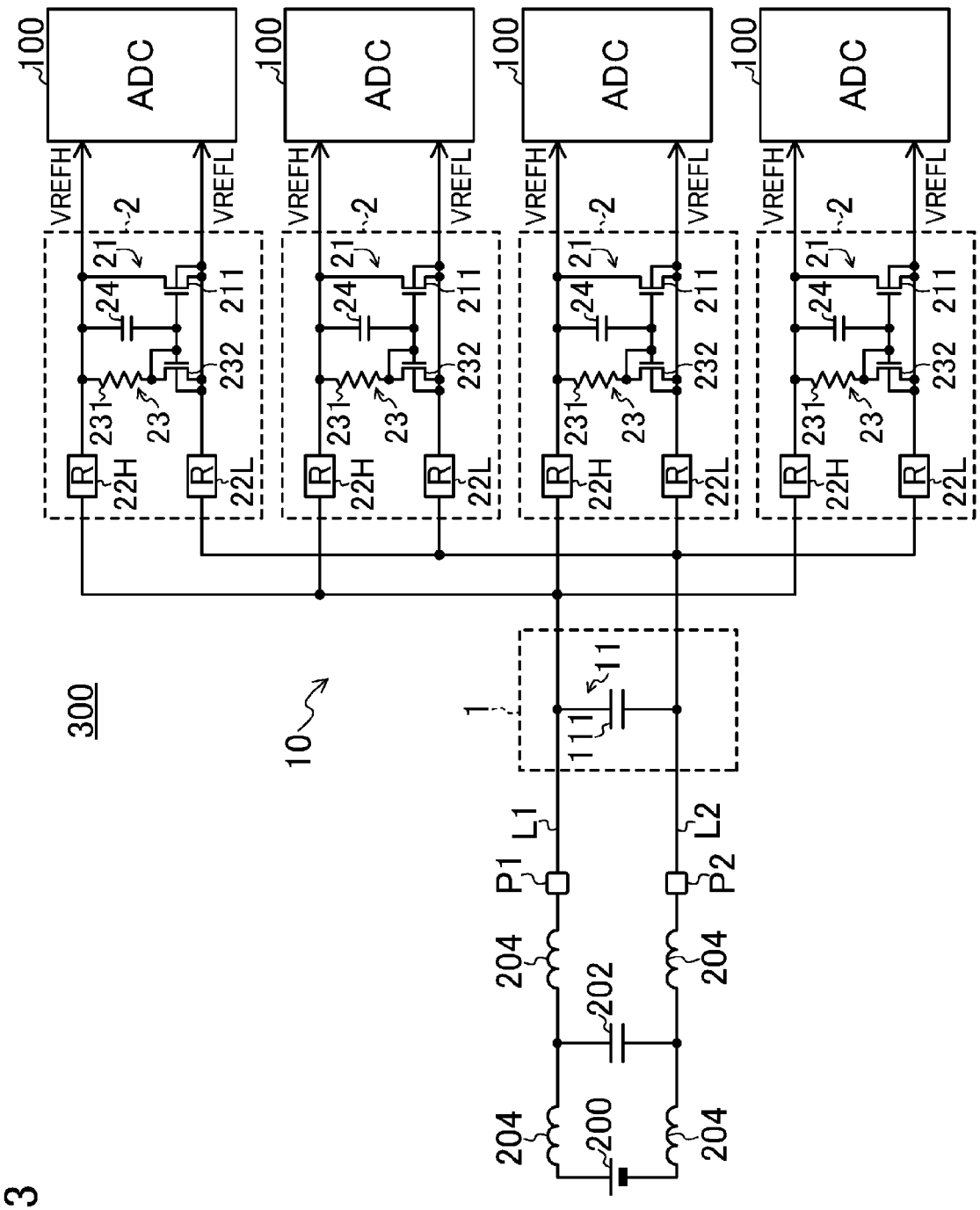
FIG. 3 is a diagram illustrating a reference voltage stabilizer circuit in which a plurality of subsequent-stage circuits are connected to a single preceding-stage circuit.

The reference voltage stabilizer circuit 10 may be modified such that a plurality of subsequent-stage circuits 2 are connected to a single preceding-stage circuit 1. FIG. 3 illustrates a configuration of the reference voltage stabilizer circuit 10 of the variation. In the present variation, four subsequent-stage circuits 2 are connected to a single preceding-stage circuit 1. Each of the subsequent-stage circuits 2 supplies stable reference voltages VREFH, VREFL to a corresponding one of AD converters 100. The four AD converters 100 may be AD converters configured to perform an interleaving operation, parallel AD converters configured to perform AD conversion of a common input signal with a common clock, or AD converters which only share a reference voltage and which are independent from each other.

As described above, if a plurality of AD converters 100 share the signal lines L1, L2, self-noise of a certain AD converter 100 may become disturbance noise for another AD converter 100. That is, self-noise of a certain AD converter 100 having a magnitude equivalent to that of self-noise of another AD converter 100 is generated at timing different from timing at which the self-noise of the another AD converter 100 is generated. In the reference voltage stabilizer circuit 10 illustrated in FIG. 3, self-noise of a certain AD converter 100 is first attenuated by the subsequent-stage circuit 2 connected to such an AD converter 100. Note that the subsequent-stage circuit 2 is delayed in responding right after noise generation. For such a reason, noise which is not attenuated by the subsequent-stage circuit 2 may leak toward the I/O pin side. However, the noise leaking toward the I/O pin side is attenuated to a great extent by a low-pass filter including the resistive circuits 22H, 22L of the subsequent-stage circuits 2 and the capacitive path 11 of the preceding-stage circuit 1. As a result, almost no self-noise of the AD converter 100 leaks toward the I/O pin side. Moreover, when the attenuated noise propagates to another AD converter 100, such noise is further attenuated by the resistive circuits 22H, 22L of each of the subsequent-stage circuit 2. Thus, even if self-noise is generated at a certain AD converter 100, the reference voltages VREFH, VREFL to be supplied to the AD converters 100 other than the certain AD converter 100 can be maintained stable, and the AD conversion accuracy can be maintained at the high level.

As described above, in the configuration in which a plurality of AD converters share signal lines for reference voltages, self-noise of a certain AD converter is prevented from influencing the reference voltages to be supplied to another AD converter. This greatly decreases the number of I/O pins and external elements for reference voltage input. Since the core area of the successive approximation AD converter is smaller than an I/O region of the successive approximation AD converter, reduction in area of the I/O region is more effective than reduction in core area.

<Variation of Preceding-Stage Circuit 1>

Figure 4A:
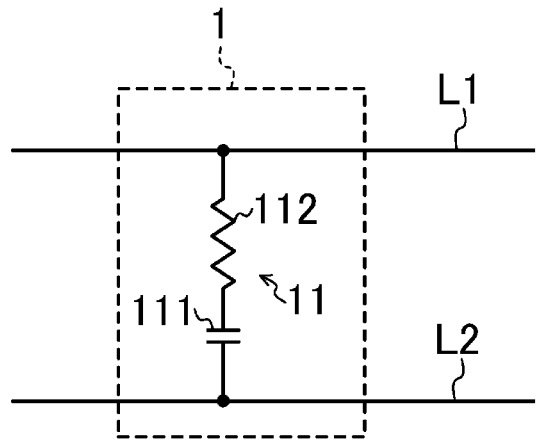
FIGS. 4A and 4B are diagrams illustrating variations of the preceding-stage circuit.
Figure 4B:
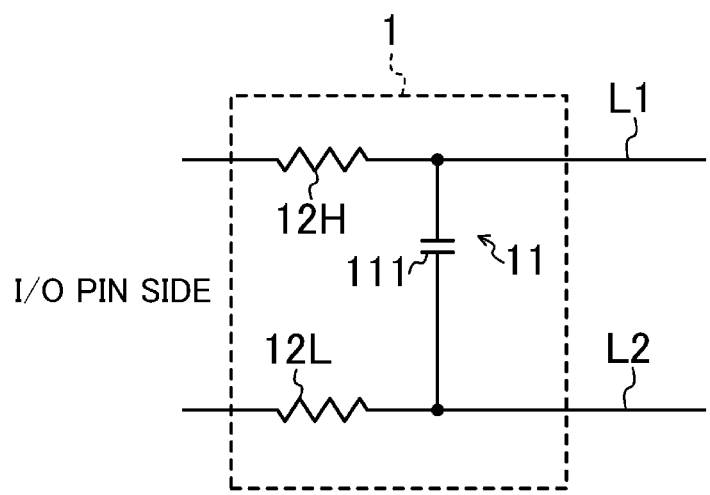

If the capacitive path 11 is formed only of the capacitive element 111 as in the example illustrated in FIG. 1, resonance occurs between the capacitive element 111 and the parasitic inductance 204. Thus, the capacitive path 11 may include, referring to FIG. 4A, the capacitive element 111 and a resistive element 112 connected together in series. Alternatively, a resistive element 12H may be, referring to FIG. 4B, inserted into the signal line L1 between the capacitive path 11 and the I/O pin P1, and a resistive element 12L may be inserted into the signal line L2 between the capacitive path 11 and the I/O pin P2. Note that the resistive element 12L is not necessary in the case where the signal line L2 is used as the ground line, and the resistive element 12H is not necessary in the case where the signal line L1 is used as the power line. The preceding-stage circuit 1 illustrated in FIG. 4B has a greater resonance reduction effect than that of the preceding-stage circuit 1 illustrated in FIG. 4A. However, since the resistive element 12H, 12L is inserted into the signal line L1, L2, the IR drop increases.

<Variation of Subsequent-Stage Circuit 2>

Figure 5:
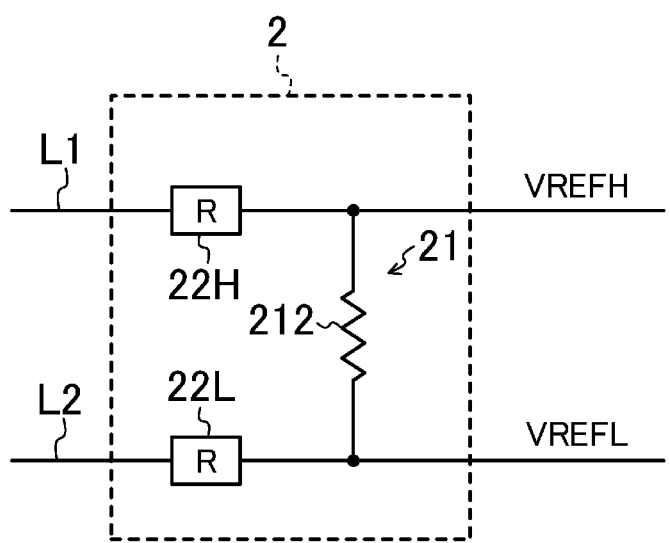
FIG. 5 is a diagram illustrating a variation of the subsequent-stage circuit.

The bias generator circuit 23 and the capacitive element 24 may be omitted from the subsequent-stage circuit 2, and the resistive path 21 may include a resistive element 212 as illustrated in FIG. 5. Since current proportional to VREFH- VREFL flows through the resistive element 212, the resistive path 21 functions to decrease the reference voltage VREFH when the reference voltage VREFH increases and to increase the reference voltage VREFH when the reference voltage VREFH decreases. However, considering a current efficiency, it is preferred that the resistive path 21 includes the transistor 211 as illustrated in FIG. 1. Suppose that the transconductance of the transistor 211 is gm. The resistive path 21 illustrated in FIG. 1 corresponds to the resistive path 21 illustrated in FIG. 5 when a resistance value of the resistive element 212 is 1/gm. However, in the case where the resistive path 21 includes the transistor 211, a required current is 1/10 to 1/20 of the case where the resistive path 21 includes the resistive element 212, and therefore the current efficiency is extremely high.

If a source follower circuit is used, the function to separate the signal line L1, L2 into the I/O pin side and the internal circuit side and the function to reduce self-noise of the AD converter 100 across a large bandwidth can be realized by a single circuit. For example, in the subsequent-stage circuit 2 illustrated in FIG. 6A, a transistor 25H is, instead of the resistive circuit 22H, inserted into the signal line L1 as the source follower circuit. That is, the signal line L1 is separated into the I/O pin side and the internal circuit side by the transistor 25H. A bias voltage generated by a bias generator circuit 26H is applied to a gate of the transistor 25H with high impedance, and a capacitive element 27L is connected between the gate of the transistor 25H and the signal line L2. Moreover, a resistive element 28 is connected between a source of the transistor 25H and the signal line L2. Current flowing through the resistive element 28 is the bias current of the transistor 25H.

Figure 6A:
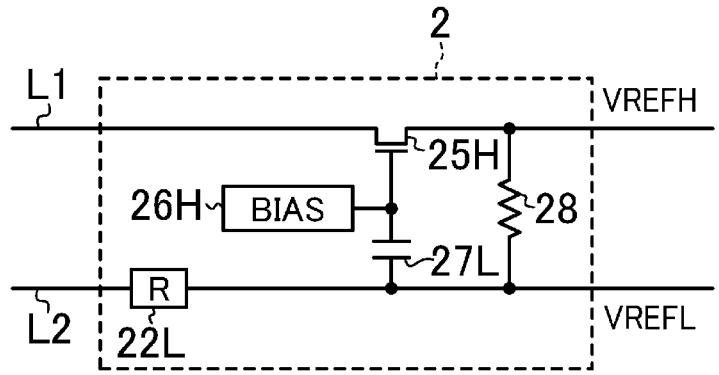
FIGS. 6A, 6B, and 6C are diagrams illustrating other variations of the subsequent-stage circuit.
Figure 6B:
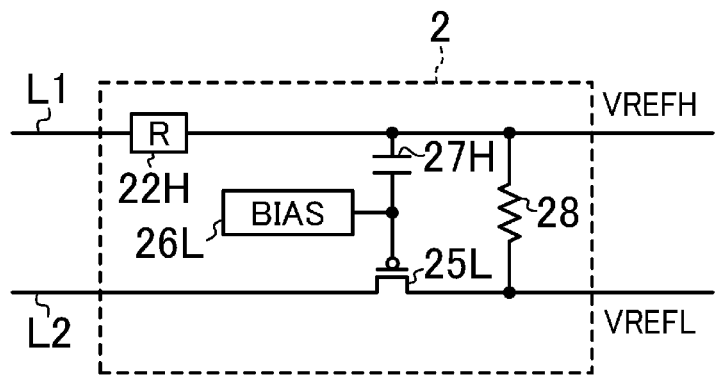

In the subsequent-stage circuit 2 illustrated in FIG. 6B, a transistor 25L is, instead of the resistive circuit 22L, inserted into the signal line L2 as the source follower circuit. That is, the signal line L2 is separated into the I/O pin side and the internal circuit side by the transistor 25L. A bias voltage generated by a bias generator circuit 26L is applied to a gate of the transistor 25L with high impedance, and a capacitive element 27H is connected between the gate of the transistor 25L and the signal line L1. Moreover, the resistive element 28 is connected between a source of the transistor 25L and the signal line L1. Current flowing through the resistive element 28 is the bias current of the transistor 25L.

Figure 6C:
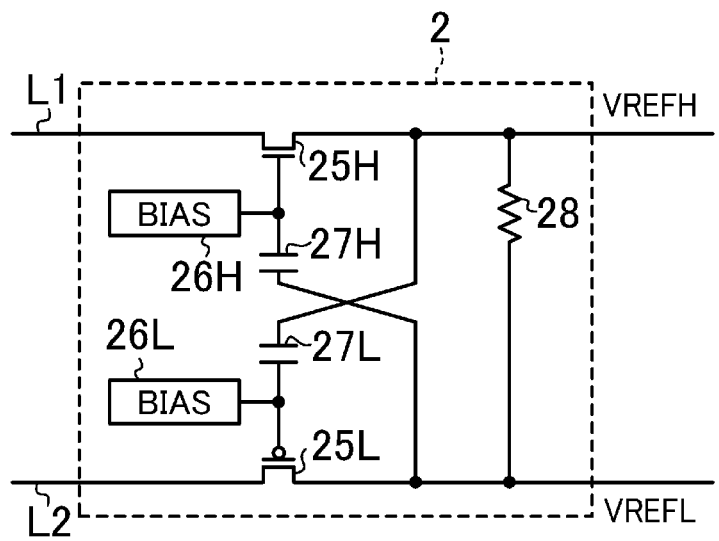

In the subsequent-stage circuit 2 illustrated in FIG. 6C, the foregoing two source follower circuits are combined together, and the transistor 25H, 25L is inserted into the signal line L1, L2 instead of the resistive circuit 22H, 22L.

An example of operation of the subsequent-stage circuits 2 of the variations will be described with reference to the configuration illustrated in FIG. 6A. In the state in which there is no noise, the gate-source voltage of the transistor 25H is maintained constant, and the reference voltage VREFH is stabilized at the point at which the reference voltage VREFH decreases from the gate voltage of the transistor 25H by the gate-source voltage thereof. For example, when the reference voltage VREFH decreases due to self-noise of the AD converter 100, the gate-source voltage of the transistor 25H increases, and current flows into the internal circuit side through the transistor 25H. As a result, the reference voltage VREFH is changed back to an initial high value. Conversely, when the reference voltage VREFH increases, the gate-source voltage of the transistor 25H decreases, and the reference voltage VREFH is changed back to an initial low value. When the reference voltage VREFL increases, the gate-source voltage of the transistor 25H increases with increasing the gate voltage of the transistor 25H through the capacitive element 27L, and therefore the reference voltage VREFH increases. This changes the voltage difference between the signal lines L1, L2 back to an initial value. Conversely, when the reference voltage VREFL decreases, the voltage difference between the signal lines L1, L2 is also changed back to the initial value by the method opposite to the foregoing. As described above, the subsequent-stage circuit 2 illustrated in FIG. 6A functions as a large-bandwidth stabilizer circuit configured to change back the voltage difference between the signal lines L1, L2 in a short time even if noise is superimposed on the signal lines L1, L2. The same applies to the subsequent-stage circuits 2 illustrated in FIGS. 6B and 6C.

Note that, if a sufficient output current can be obtained from the transistor 25H, 25L to the internal circuit side, the resistive element 28 may be omitted.

In the subsequent-stage circuit 2 of each of the variations illustrated in FIGS. 6A, 6B, and 6C, there is a disadvantage that a difference between the reference voltages VREFH, VREFL decreases by the drain-source voltages of the transistors 25H, 25L. However, such a disadvantage can be overcome in such a manner that a voltage to be input to the I/O pin P1 is increased in advance. Thus, the subsequent-stage circuit 2 illustrated in FIG. 1 or 5 can supply a reference voltage having a greater amplitude to the AD converter 100, and is advantageous to S/N properties. Conversely, the subsequent-stage circuit 2 of each of the variations illustrated in FIGS. 6A, 6B, and 6C has an advantage that the reference voltage VREFH, VREFL can be changed without changing an external voltage to be input to the I/O pin P1, P2 in such a manner that the gate voltage of the transistor 25H, 25L is arbitrarily changed.

Figure 7:
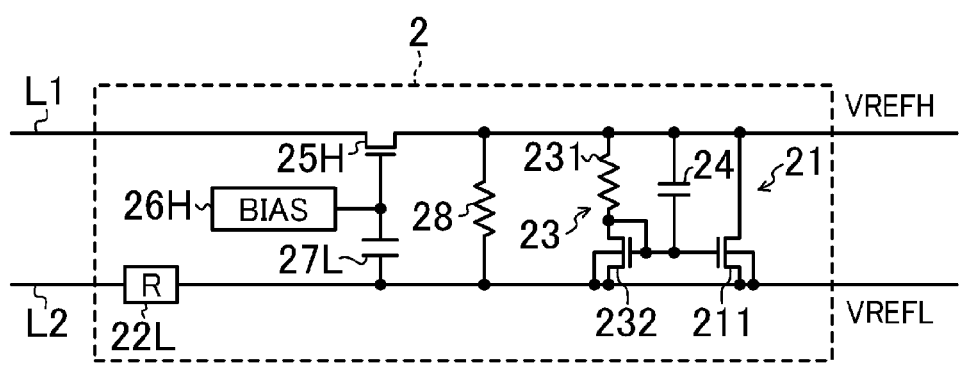
FIG. 7 is a diagram illustrating still another variation of the subsequent-stage circuit.

A circuit part including the resistive path 21, the bias generator circuit 23, and the capacitive element 24 of the subsequent-stage circuit 2 illustrated in FIG. 1 may be added to the subsequent-stage circuit 2 of each of the variations illustrated in FIGS. 6A, 6B, and 6C. FIG. 7 illustrates the example where such a circuit part is added to the subsequent-stage circuit 2 illustrated in FIG. 6A. Addition of the circuit part can further enhance properties of widening the bandwidth of the subsequent-stage circuit 2 of each of the variations illustrated in FIGS. 6A, 6B, and 6C.

<Countermeasures Against PVT Variation>

The IR drop occurs due to the resistive circuit 22H, 22L inserted into the signal line L1, L2. The IR drop changes depending on PVT variation, i.e., variation in temperature, voltage, and process of an integrated circuit. This lowers the AD conversion accuracy. Thus, the PVT variation may be absorbed in the following manner.

Figure 8:
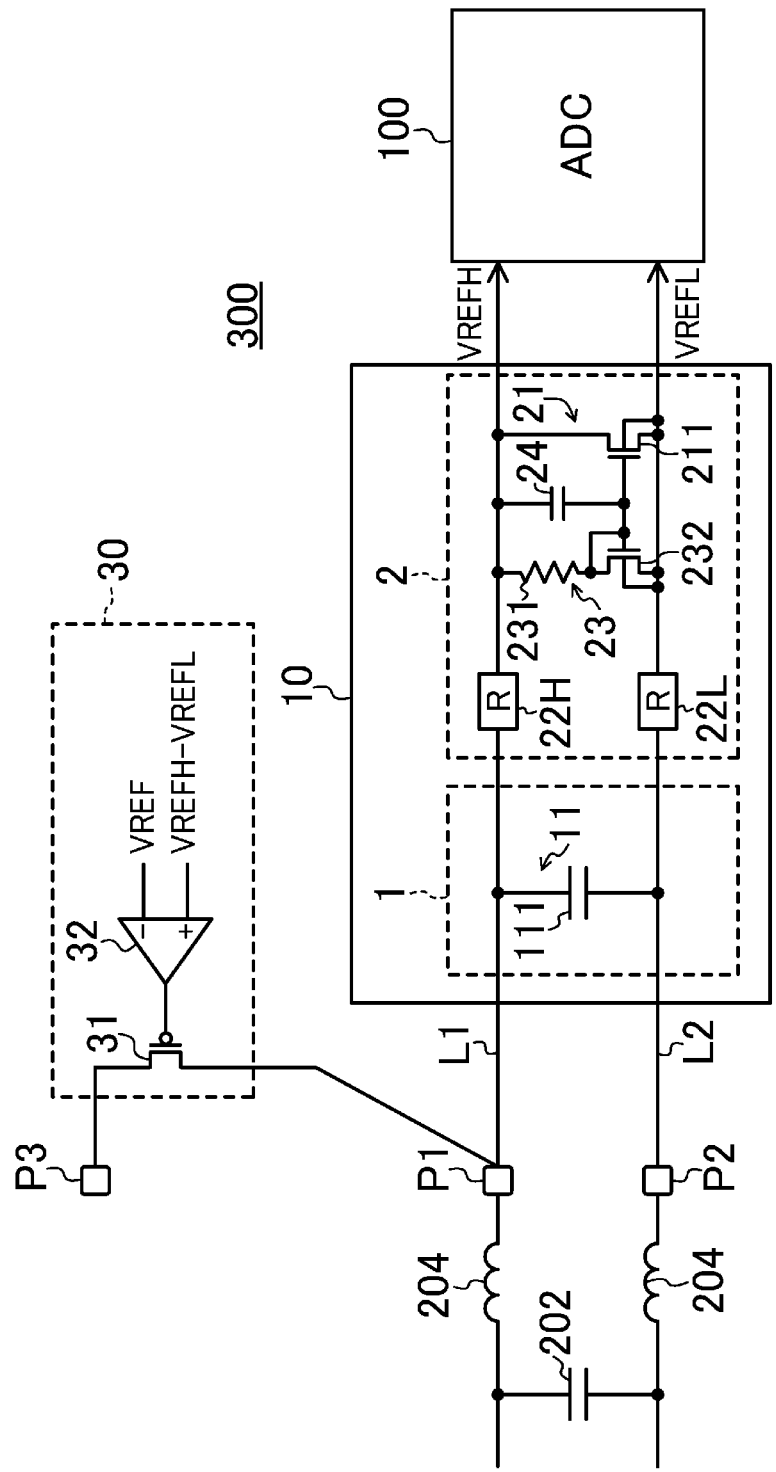
FIG. 8 is a configuration diagram of an integrated circuit to which a regulator configured to generate a reference voltage is added.

For example, a regulator 30 configured to generate the reference voltage VREFH is, referring to FIG. 8, provided in the integrated circuit 300. That is, the external voltage is not connected to the I/O pin P1, and the output voltage of the regulator 30 is connected to the I/O pin P1. The regulator 30 may include, e.g., a transistor 31 having a source connected to an I/O pin P3 and having a drain connected to the I/O pin P1, and an error amplifier 32 configured to output an error between the voltage difference between the signal lines L1, L2 and a predetermined voltage VREF to a gate of the transistor 31. For example, the power-supply voltage of the integrated circuit 300 is input to the I/O pin P3. The voltage VREF is supplied from a not-shown reference voltage supply in the integrated circuit 300.

According to the foregoing configuration, the regulator 30 performs a feedback control such that VREFH-VREFL is the predetermined voltage VREF. The external bypass capacitor (capacitive element 202) also functions to compensate for the phase of the regulator 30. According to the configuration illustrated in FIG. 8, the PVT variation in association with the IR drop can be absorbed, and the stable reference voltages VREFH, VREFL can be constantly supplied to the AD converter 100.

If the reference voltage VREFL is the ground potential, the regulator 30 may only perform feedback of the reference voltage VREFH. Moreover, in the case of small PVT variation, the regulator 30 may perform feedback of the voltage of the I/O pin P1 instead of the reference voltage VREFH. In such a case, since direct feedback of the output of the regulator 30 is performed, a control loop of the regulator 30 is simplified, and a more stable circuit is realized.

There are a plurality of operation modes to switch the magnitude of the voltage VREF depending on each operation mode, thereby performing range adjustment for the AD converter 100.

When the reference voltages VREFH, VREFL change due to the PVT variation, the AD conversion gain of the AD converter 100 also changes. Thus, referring to, e.g., FIG. 9, an input switcher 101 configured to switch the input of the AD converter 100 and a gain error corrector 109 configured to correct an AD conversion gain error for the digital output of the AD converter 100 are provided in the integrated circuit 300 to absorb the PVT variation in a digital region after AD conversion. Specifically, the input switcher 101 inputs the analog input voltage IN to the AD converter 100 upon a normal operation, and inputs two types of VCAL reference voltages (Vcal1 and Vcal2) to the AD converter 100 upon calibration. The gain error corrector 109 calculates, according to the following expression, an AD conversion gain ADG from AD conversion codes Dout1, Dout2 for the VCAL reference voltages Vcal1, Vcal2:

$$ADG=(Dout2-Dout1)/(Vcal2-Vcal1)$$

In the normal operation in which the analog input voltage IN is input to the AD converter 100, the gain error corrector 109 multiplies, in the digital region, a digital signal OUT output from the AD converter 100 by a correction gain coefficient obtained based on the AD conversion gain ADG such that the AD conversion gain reaches a target value. Thus, the PVT variation in association with the IR drop can be absorbed, and the stable reference voltages VREFH, VREFL can be constantly supplied to the AD converter 100.

Figure 9:
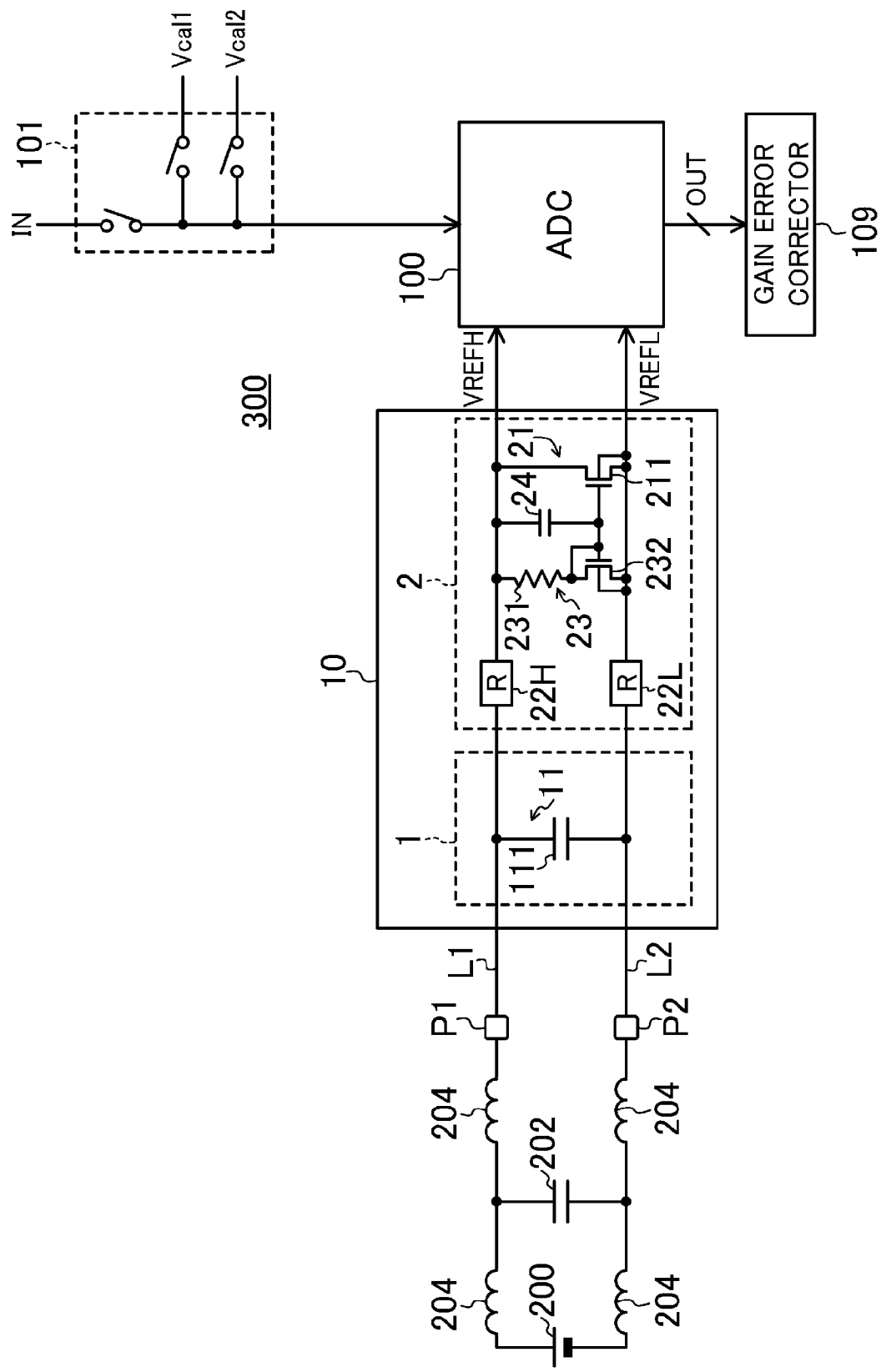
FIG. 9 is a configuration diagram of an integrated circuit to which a corrector configured to correct output of an AD converter is added.

Note that the regulator 30 illustrated in FIG. 8 may be added to the configuration illustrated in FIG. 9 to supply the more stable reference voltages VREFH, VREFL.

In the foregoing description, the AD converter 100 is, for the sake of simplicity, the successive approximation AD converter, but the present disclosure is not limited to the successive approximation AD converter. The AD converter 100 may be other types of AD converters operated discretely with clock signals, such as pipeline AD converters, flash AD converters, and delta-sigma AD converters. Moreover, the internal circuit receiving the reference voltages VREFH, VREFL is not limited to the AD converter 100, and any circuits may be employed as long as the circuits are operated with reference to reference voltages.

The reference voltage stabilizer circuit of the present disclosure can simultaneously reduce both of disturbance noise and self-noise of the internal circuit to stabilize the reference voltages. Thus, the present disclosure can be applied for SoC in which many internal circuits are integrated. In particular, the present disclosure is useful for successive approximation AD converters for which reference voltages are required with a high accuracy, and interleaved or parallelized successive approximation AD converters. Moreover, since the present disclosure is less susceptible to a parasitic inductance of a package of an integrated circuit, the present disclosure can be used for inexpensive package products. In addition, since an I/O pin for reference voltage can be shared by a plurality of AD converters, the present disclosure can be used for products in each of which many AD converters are mounted.

Other implementations are contemplated.

What is claimed is:

1. A reference voltage stabilizer circuit for stabilizing a reference voltage to be supplied through at least one of first or second signal lines, comprising:
    a preceding-stage circuit including a capacitive path connected between the first and second signal lines; and
    a subsequent-stage circuit including
        a transistor inserted into one of the first or second signal lines through which the reference voltage is supplied and having a gate to which a bias voltage is applied,
        a bias generator circuit configured to generate the bias voltage, and
        a capacitive element connected between the gate of the transistor and the other one of the first or second signal lines into which the transistor is not inserted,
    wherein the subsequent-stage circuit further includes a resistive path connected between a source of the transistor and the other one of the first or second signal lines.

2. A reference voltage stabilizer circuit for stabilizing a reference voltage to be supplied through at least one of first or second signal lines, comprising:
    a preceding-stage circuit including a capacitive path connected between the first and second signal lines; and
    a subsequent-stage circuit including
        a transistor inserted into one of the first or second signal lines through which the reference voltage is supplied and having a gate to which a bias voltage is applied,
        a bias generator circuit configured to generate the bias voltage, and
        a capacitive element connected between the gate of the transistor and the other one of the first or second signal lines into which the transistor is not inserted,
    wherein the subsequent-stage circuit further includes a resistive circuit inserted, between the capacitive path and the capacitive element, into the other one of the first or second signal lines.

3. The reference voltage stabilizer circuit of claim 1, wherein
    the resistive path includes a transistor having a gate to which a bias voltage is applied, and
    the subsequent-stage circuit further includes
        a bias generator circuit configured to generate the bias voltage depending on a voltage between both ends of the resistive path, and
        a capacitive element connected between a drain and the gate of the transistor of the resistive path.

4. The reference voltage stabilizer circuit of claim 1, wherein the resistive path includes a resistive element.

5. The reference voltage stabilizer circuit of claim 2, wherein the resistive circuit includes a resistive element.

6. The reference voltage stabilizer circuit of claim 2, wherein
    the resistive circuit includes a transistor having a gate to which the bias voltage is applied.

7. An integrated circuit, comprising:
    the reference voltage stabilizer circuit of claim 1; and
    an AD converter configured to convert an input analog signal into a digital signal with reference to the reference voltage stabilized by the reference voltage stabilizer circuit.

8. An integrated circuit, comprising:
the reference voltage stabilizer circuit of claim 2; and
an AD converter configured to convert an input analog signal into a digital signal with reference to the reference voltage stabilized by the reference voltage stabilizer circuit.

9. An integrated circuit, comprising:
a reference voltage stabilizer circuit for stabilizing a reference voltage to be supplied through at least one of first or second signal lines;
an AD converter configured to convert an input analog signal into a digital signal with reference to the reference voltage stabilized by the reference voltage stabilizer circuit; and
a regulator configured to generate the reference voltage, wherein:
the reference voltage stabilizer circuit comprises:
   a preceding-stage circuit including a capacitive path connected between the first and second signal lines; and
   a subsequent-stage circuit including:
      a resistive path connected between the first and second signal lines, and
      a resistive circuit inserted, between the capacitive path and the resistive path, into one of the first or second signal lines through which the reference voltage is supplied, and
the regulator performs a feedback control of the reference voltage depending on an error between a voltage difference between the first and second signal lines and a predetermined voltage.

10. The integrated circuit of claim 9, further comprising:
an input switcher configured to switch input of the AD converter; and
a gain error corrector configured to correct, for the digital signal output from the AD converter, an AD conversion gain error of the AD converter.

* * * * *